US007667994B1

(12) United States Patent
Moriya et al.

(10) Patent No.: US 7,667,994 B1
(45) Date of Patent: Feb. 23, 2010

(54) MAGNETIC RACETRACK WITH CURRENT-CONTROLLED MOTION OF DOMAIN WALLS WITHIN AN UNDULATING ENERGY LANDSCAPE

(75) Inventors: Rai Moriya, San Jose, CA (US); Stuart Parkin, San Jose, CA (US); Luc Thomas, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/552,667

(22) Filed: Sep. 2, 2009

Related U.S. Application Data

(62) Division of application No. 12/197,155, filed on Aug. 22, 2008.

(51) Int. Cl.
*G11C 19/00* (2006.01)
(52) U.S. Cl. .......................... 365/81; 365/158; 365/171; 365/78; 365/80; 977/933
(58) Field of Classification Search ................... 365/48, 365/66, 78, 80–85, 100, 148, 158, 171, 173, 365/225.5, 243.5; 257/421, E21.665; 438/3; 977/933–935
See application file for complete search history.

(56) References Cited

U.S. PATENT DOCUMENTS

| 3,432,828 | A | 3/1969 | Barker et al. | |
|---|---|---|---|---|
| 4,231,107 | A | 10/1980 | Schwee et al. | |
| 6,834,005 | B1 * | 12/2004 | Parkin | 365/80 |
| 6,970,379 | B2 | 11/2005 | Parkin | |
| 2004/0251232 | A1 * | 12/2004 | Chen et al. | 216/22 |
| 2005/0018478 | A1 * | 1/2005 | Nagase et al. | 365/171 |
| 2005/0078509 | A1 * | 4/2005 | Parkin | 365/158 |
| 2005/0078511 | A1 * | 4/2005 | Parkin | 365/171 |
| 2005/0186686 | A1 * | 8/2005 | Chen et al. | 438/3 |
| 2006/0120132 | A1 * | 6/2006 | Parkin | 365/80 |
| 2007/0278603 | A1 * | 12/2007 | Ochiai et al. | 257/421 |
| 2008/0080092 | A1 * | 4/2008 | Kim | 360/110 |
| 2008/0080234 | A1 * | 4/2008 | Iwata et al. | 365/171 |
| 2008/0253161 | A1 * | 10/2008 | Parkin et al. | 365/80 |

(Continued)

OTHER PUBLICATIONS

Hayashi et al., "Dependence of Current and Field Driven Depinning of Domain Walls on Their Structure and Chirality in Permalloy Nanowires", Physical Review Letters, Nov. 2006, 207205-1-207205-4, vol. 97, Issue 207205, The American Physical Society, USA.

(Continued)

*Primary Examiner*—Vu A Le
*Assistant Examiner*—Harry W Byrne
(74) *Attorney, Agent, or Firm*—Daniel E. Johnson

(57) ABSTRACT

A method for use with a magnetic racetrack device includes placing domain walls having a first structure and domain walls having a second, different structure along the racetrack at stable positions corresponding to different regions within the device. The domain walls having the first structure and the domain walls having the second structure occupy alternating positions along the racetrack. A current pulse is applied to the racetrack, so that each of the domain walls moves to an adjacent region. This results in a transformation of the domain walls having the first structure into domain walls having the second structure, and vice versa. The first structure may be a vortex structure and the second structure may be a transverse structure.

7 Claims, 15 Drawing Sheets

U.S. PATENT DOCUMENTS

2008/0278998 A1* 11/2008 Cowburn et al. ............ 365/171
2009/0147562 A1* 6/2009 Clinton et al. .............. 365/158

OTHER PUBLICATIONS

Faulkner et al., "Artificial Domain Wall Nanotraps in Ni81Fe19 Wires", Journal of Applied Physics, Jun. 2004, 6717-6719, vol. 95, No. 11, American Institute of Physics, USA.

Himeno et al., "Dynamics of a Magnetic Domain Wall in Magnetic Wires with an Artificial Neck", Journal of Applied Physics, May 2003, 8430-8432, vol. 93, No. 10, American Institute of Physics, USA.

Holleitner et al., "Pinning a domain wall in (Ga, Mn)As with focused ion beam lithography", Applied Physics Letters, Dec. 2004, pp. 5622-5624, vol. 85, No. 23, American Institute of Physics, USA.

Nagahama et al., "Electric resistance of magnetic domain wall in NiFe wires with CoSm pinning pads", Journal of Applied Physics, May 2000, pp. 5648-5650, vol. 87, No. 9, American Institute of Physics, USA.

Thomas et al., "Oscillatory dependence of current-driven magnetic domain wall motion on current pulse length", Letters, Sep. 2006, pp. 197-200, vol. 443, Nature Publishing Group, USA.

Thomas et al., "Resonant Amplification of Magnetic Domain-Wall Motion by a Train of Current Pulses", Science, Mar. 2007, pp. 1553-1556, vol. 315, American Association for the Advancement of Science, USA.

Parkin et al., "Magnetic Domain-Wall Racetrack Memory", Science, Apr. 2008, pp. 190-194, vol. 320, American Association for the Advancement of Science, USA.

Hayashi et al., "Current-Controlled Magnetic Domain-Wall Nanowire Shift Register", Science, Apr. 2008, pp. 209-211, vol. 320, American Association for the Advancement of Science, USA.

Supporting Online Material for: Parkin et al., "Magnetic Domain-Wall Racetrack Memory," Science, Apr. 2008, vol. 320, pp. 1-11, American Association for the Advancement of Science, Washington DC, USA.

Supporting Online Material for: Hayashi et al., "Current-Controlled Magnetic Domain-Wall Nanowire Shift Register," Science, Apr. 2008, vol. 320, pp. 1-9, American Association for the Advancement of Science, Washington DC, USA.

* cited by examiner

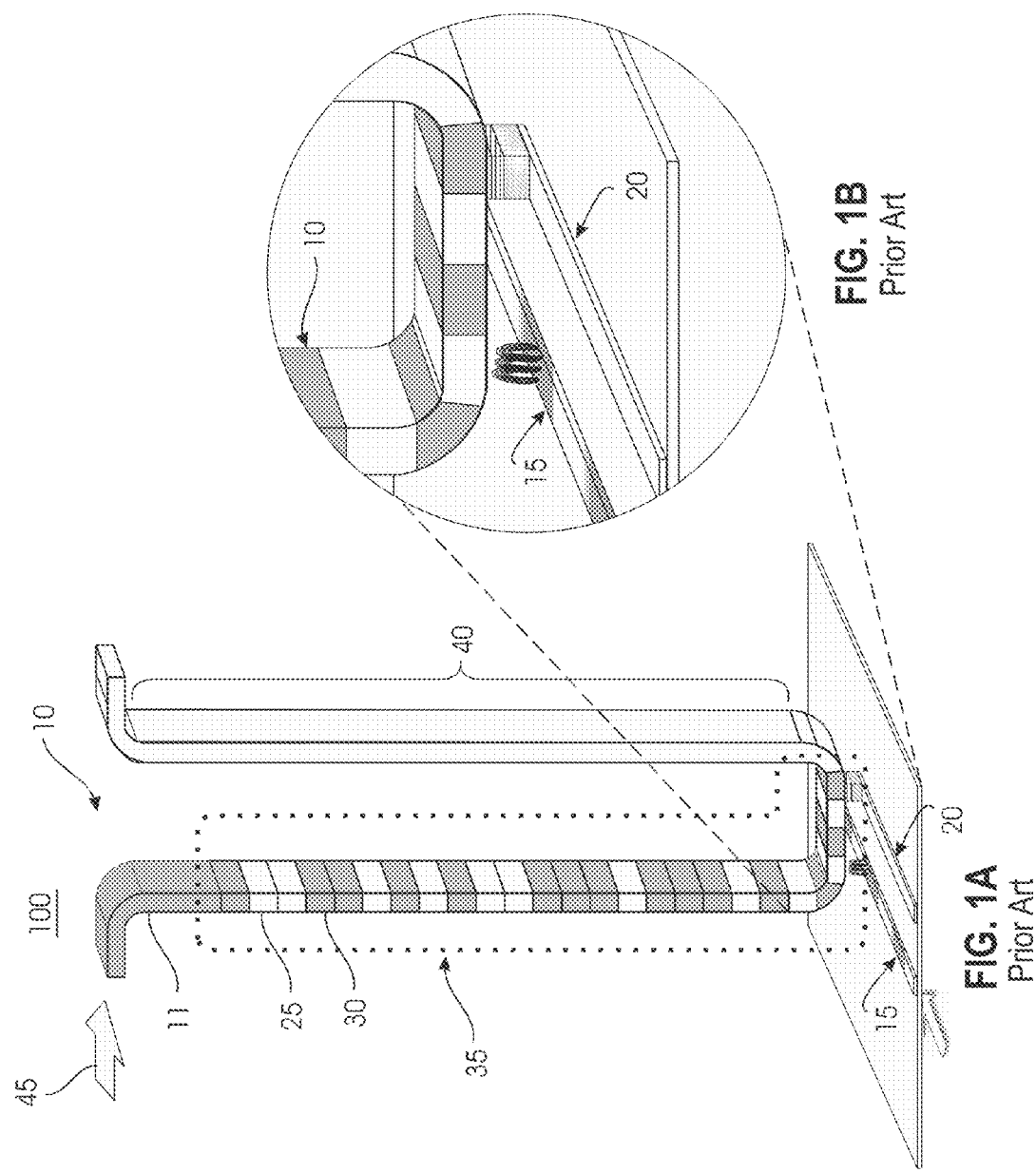

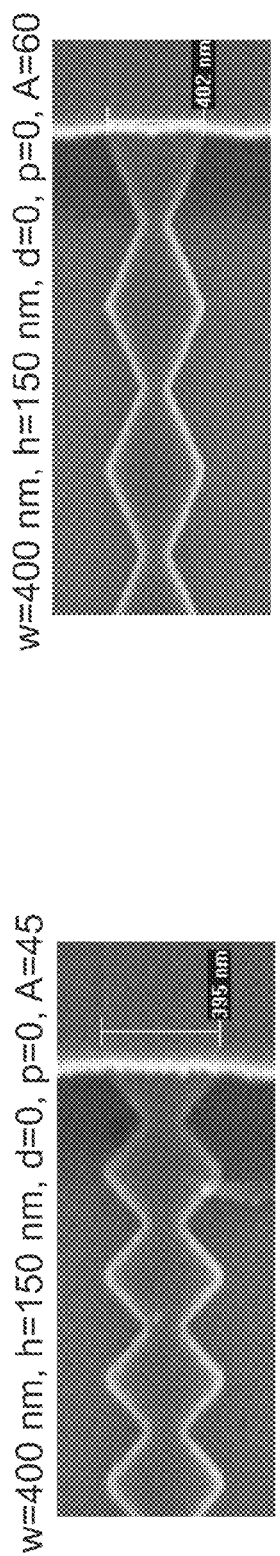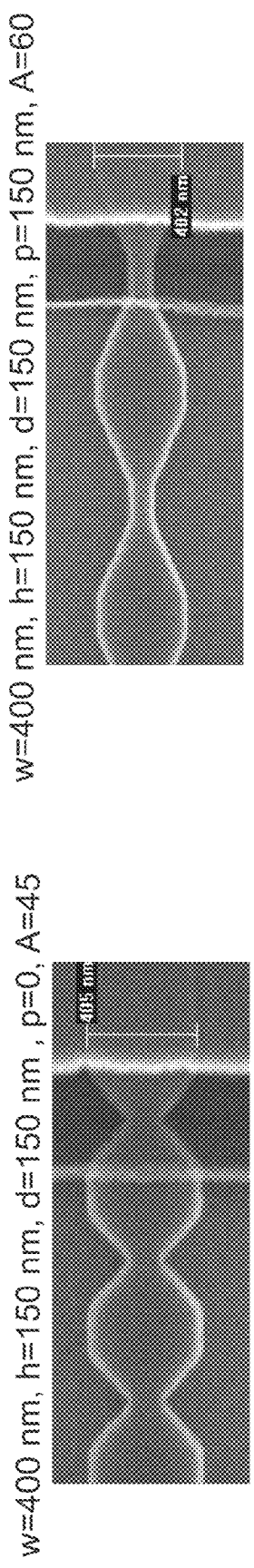
FIG. 5B
FIG. 5C
FIG. 5D
FIG. 5E

MAGNETIC RACETRACK WITH CURRENT-CONTROLLED MOTION OF DOMAIN WALLS WITHIN AN UNDULATING ENERGY LANDSCAPE

This application is a divisional of Applicants' copending U.S. application Ser. No. 12/197,155 filed Aug. 22, 2008 and entitled "Magnetic racetrack with current-controlled motion of domain walls within an undulating energy landscape", which is hereby incorporated by reference.

This invention was made with Government support under Contract No. H94003-05-2-0505 awarded by the U.S. Department of Defense. The Government has certain rights in the invention.

TECHNICAL FIELD

The present invention relates to memory storage systems, and particularly to a memory storage system that uses current to move magnetic domain walls across read and write devices, allowing data to be stored in, and read out of, domains or domain walls in a magnetic racetrack.

BACKGROUND

Racetrack memory devices are gaining interest as high-density storage devices. These devices are disclosed, for example, in U.S. Pat. No. 6,834,005 titled "Shiftable magnetic register and method of using the same" issued Dec. 21, 2004 to Parkin, which is hereby incorporated by reference. FIG. 1 (which includes FIGS. 1A and 1B) illustrates an exemplary high-level architecture of such a racetrack magnetic memory system 100 comprising a magnetic shift register 10 that utilizes a writing device (also referred to herein as writing element) 15 and a reading device (also referred to herein as reading element) 20. Both the reading device 20 and the writing device 15 form a read/write element of system 100.

The magnetic shift register 10 comprises a track 11 made of ferromagnetic material. The track 11 can be magnetized in small sections, or domains, in one direction or another. Information is stored in regions such as domains 25, 30 in the track 11. The order parameter of the magnetic material from which the track is fabricated, which is the magnetization direction or the direction of the magnetic moment, changes from one direction to another. This variation in the direction of the magnetic moment forms the basis for storing information in the track 11.

In one embodiment, the magnetic shift register 10 comprises a data region 35 and a reservoir 40. The data region 35 comprises a contiguous set of domains such as domains 25, 30 that store data. Additional length is provided to the magnetic shift register 10 in the form of a reservoir 40.

The reservoir 40 is made sufficiently long so that it accommodates all the domains in the region 35 when these domains are moved completely from region 35 across the writing and reading elements (for the purposes of writing and reading domains) into region 40. At any given time, the domains are thus stored partially in region 35 and partially in region 40, so it is the combination of region 35 and region 40 that forms the storage element. In one embodiment, the reservoir 40 is where the reservoir region is devoid of magnetic domains in a quiescent state.

Thus, the storage region 35 at any given time may be located within a different portion of the magnetic shift register 10, and the reservoir 40 would be divided into two regions on either side of the storage region 35. Although the storage region 35 is one contiguous region, and in one embodiment of this application the spatial distribution and extent of the domains within the storage region 35 would be approximately the same no matter where the storage region 35 resides within the shift register 10, in another embodiment, portions of the storage region may be expanded during the motion of this region particularly across the reading and writing elements. A portion of (or even the entire) data region 35 is moved into the reservoir 40 to access data in specific domains.

The reservoir 40 is shown in FIG. 1 as approximately the same size as the data region 35. However, other alternative embodiments may allow the reservoir 40 to have a different size than the data region 35. As an example, the reservoir 40 could be much smaller than the data region 35 if more than one reading and writing element were used for each magnetic shift register. For example, if two reading and writing elements were used for one shift register and were disposed equally along the length of the data region, then the reservoir would only need to be approximately half as long as the data region.

An electric current 45 is applied to the track 11 to move the magnetic moments within domains 25, 30 along the track 11, past the reading device 20 or the writing device 15. The domains arrayed along the track are separated from one another by boundaries which are called domain walls (DWs). In a magnetic material with domain walls, a current passed across the domain walls moves the domain walls in the direction in or opposite to the current flow, depending on the characteristics of the magnetic material comprising the racetrack. As the current passes through a domain, it becomes "spin polarized". When this spin polarized current passes through into the next domain across the intervening domain wall, it develops a spin torque. This spin torque moves the domain wall. Domain wall velocities can be very high, i.e., on the order of 100 m/sec or more, so that the process of moving a particular domain to the required position for the purposes of reading this domain or for changing its magnetic state by means of the writing element can be very short.

The domains, such as domains 25, 30, 31 are moved (or shifted) back and forth over the writing device 15 and reading device 20, in order to move the data region 35 in and out of the reservoir 40, as shown in FIG. 2 (which includes FIGS. 2A, 2B, and 2C). In the example of FIG. 2A, the data region 35 could initially reside on the left side of the well, i.e., bottom section 32 of the magnetic shift register 10, with no domains in the reservoir 40. FIG. 2C shows the case where the data region 35 resides entirely on the right side of the magnetic shift register 10.

In order to write data in a specific domain, such as domain 31, a current 45 is applied to the magnetic shift register 10 to move domain 31 over, and in alignment with, the writing device 15. All the domains in the data region 35 move when the current is applied to the magnetic shift register.

The movement of the domains is controlled by both the magnitude and direction of the current, and the time over which the current is applied. In one embodiment, one current pulse of a specified shape (magnitude versus time) and duration is applied to move the domains in the storage region in one increment or step. A series of pulses are applied to move the domains the required number of increments or steps. Thus, a shifted portion 205 (FIG. 2B) of the data region 35 is pushed (shifted or moved) into the reservoir region 40. The direction of motion of the domains within the track 11 depends on the direction of the applied current.

In order to read data in a specific domain, such as domain 25, additional current is applied to the magnetic shift register 10 to move domain 25 over, and in alignment with, the reading device 20. A larger shifted portion 210 of the data region 35 is pushed (shifted or moved) into the reservoir 40.

The reading and writing devices shown in FIGS. 1 and 2 form part of a control circuit that defines a reference plane in which the reading and writing devices are arrayed. In one embodiment, the magnetic shift register 10 stands vertically out of this reference plane, largely orthogonal to this plane.

In order to operate the magnetic shift register 10 the control circuit includes, in addition to the reading and writing elements, logic and other circuitry for a variety of purposes, including the operation of the reading and writing devices, the provision of current pulses to move the domains within the shift register, the means of coding and decoding data in the magnetic shift register, etc. In one embodiment, the control circuit is fabricated using CMOS processes on a silicon wafer. The magnetic shift registers will be designed to have a small footprint on the silicon wafer, so as to maximize the storage capacity of the memory device while utilizing the smallest area of silicon to keep the lowest possible cost.

In the embodiment shown in FIG. 1, the footprint of the shift register will be determined largely by the area of the wafer that the reading and writing devices occupy. Thus, the magnetic shift register will be comprised of tracks extending largely in the direction out of the plane of the wafer. The length of the tracks in the vertical direction will determine the storage capacity of the shift register. Since the vertical extent can be much greater than the extent of the track in the horizontal direction, hundreds of magnetic bits can be stored in the shift register yet the area occupied by the shift register in the horizontal plane is very small. Thus, the shift register can store many more bits for the same area of silicon wafer as compared to conventional solid state memories.

Although the tracks of the magnetic shift register are shown as being largely orthogonal (i.e., "vertical") to the plane of the reading and writing elements (the circuitry plane) these tracks can also be inclined, at an angle, to this reference plane, as an example, for the purpose of greater density or for ease of fabrication of these devices. The tracks can even be parallel to the surface of the reference plane, i.e., they may have a "horizontal" configuration.

In an entirely uniform, smooth and magnetically homogeneous track the energy of a domain wall does not depend on its position along the track and thus a domain wall may not be stable against thermal fluctuations and parasitic magnetic fields, e.g., those from nearby domain walls in the same or adjacent tracks. By varying the structure of the racetrack (see U.S. Pat. No. 6,834,005 to Parkin), preferred positions for the domain walls along the track can be formed where the energy of the domain wall is decreased. These "pinning sites" thus play an important role in defining energetically stable positions for the DWs and thereby the spacing between consecutive bits.

SUMMARY OF THE INVENTION

Embodiments of a magnetic storage racetrack device are disclosed in which the racetrack includes pinning sites, as well as segments in which the domain wall energy profile is modulated or undulatory in nature. In particular, stable domain wall (DW) positions corresponding to the pinning sites (where the energy is a local minimum) are separated by segments having relatively greater domain wall energy (that act like respective energy barriers). Thus, DWs positioned in one of these segments at the end of a current pulse are relatively unstable and move towards a pinning site (a stable position) once the current is turned off, so as to minimize their energy. In this manner, DWs eventually come to rest at one of the pinning sites.

One aspect of the invention is a device that includes a track that includes magnetic material, in which the track is designed to contain magnetic regions that can be shifted along the track in response to electric current passing through the track. The device also includes at least one component for reading and writing data represented by magnetic regions in the track. The track itself includes i) pinning sites corresponding to respective local minima of a given magnetic region's energy, with these pinning sites being capable of pinning the given magnetic region; and ii) a segment, between each pair of adjacent pinning sites, in which the energy of the given magnetic region varies substantially continuously with position along the track while being greater than at least one of the energy minima of the adjacent pinning sites—this segment is free of any site capable of pinning the given magnetic region. In a preferred embodiment, the magnetic regions are magnetic domain walls. The segments between the pinning sites may advantageously be defined by the contour of the track, e.g., the track may have a scalloped shape.

Another aspect of the invention is a device that includes a track that includes magnetic material, with the track being designed to contain magnetic regions that represent data, in which electric current applied to the track shifts magnetic regions along the track. The device further includes at least one component for reading and writing data represented by magnetic regions in the track. The track itself includes i) pinning sites corresponding to respective local minima of a given magnetic region's energy, in which the pinning sites are capable of pinning the given magnetic region; but ii) no segment between adjacent pinning sites in which the energy of the given magnetic region is sufficiently constant as a function of position along the track that the given magnetic region does not move to one of the adjacent pinning sites in the absence of electric current being applied to the track.

Another aspect of the invention is a device that includes a track of magnetic material through which magnetic regions can be moved, with the track having along its length various pinning sites that act to pin respective magnetic regions in the absence of applied current. The energy of a given magnetic region as a function of position along the track (between adjacent pinning sites) varies so that the given magnetic region is urged toward and moves to a pinning site in the absence of applied current. The device further includes at least one element for reading data to and writing data from magnetic regions in the track. A current pulse may be applied to the track, so that the given magnetic region is moved from one pinning site to another pinning site. The current pulse is advantageously chosen so that the given magnetic region may not be at a pinning site when the current pulse ends but rather may be at some intermediate point; the given magnetic region nevertheless moves to said another pinning site after the current pulse ends, with the energy of the magnetic region decreasing from the intermediate point to said another pinning site. In this manner, a plurality of magnetic regions can be moved along the track to respective adjacent pinning sites.

Another aspect of the invention is a method for use with a magnetic racetrack device having given regions, wherein the method includes placing domain walls having a first structure and domain walls having a second, different structure along the racetrack at stable positions corresponding to the given regions, with the domain walls having the first structure and the domain walls having the second structure occupying alternating positions along the racetrack. The method further includes applying a current pulse to the racetrack, so that each of the domain walls moves to an adjacent one of the given regions, in which (i) the domain walls having the first structure move from regions where they have a local minimum energy to adjacent regions where the energy of domain walls having the first structure is a local maximum, with a concomitant transformation of the domain walls having the first structure into domain walls having the second structure; and (ii) the domain walls having the second structure move from regions where they have a local minimum energy to adjacent regions where the energy of domain walls having the second structure is a local maximum, with a concomitant transformation of the domain walls having the second structure into domain walls having the first structure. The first structure may be a vortex structure, and the second structure may be a transverse structure. A subsequent current pulse may be (repeatedly) applied to the racetrack device, so that each domain wall moves to another one of the given regions. In one implementation of the method, the given regions correspond to alternating local minimum and maximum cross sections of the racetrack. In another implementation of the method, the given regions correspond to alternating magnetic properties of the racetrack.

BRIEF DESCRIPTION OF THE DRAWINGS

FIG. 1, which includes FIGS. 1A and 1B, represents a schematic illustration of an exemplary operating environment in which a magnetic shift register system of the present invention can be used.

FIG. 2, which includes

FIG. 3, which includes

In FIG. 3A, the energy minima (stable states) are separated by regions where the energy landscape is flat (i.e., the energy is constant), as in the prior art;

In FIG. 3B, an undulating domain wall energy landscape is shown, in which the domain wall energy is modulated periodically, such that neighboring energy minima are separated by energy barriers; and In FIG. 3C, an asymmetric undulating domain wall energy landscape is illustrated.

FIG. 4, which includes

FIG. 5, which includes FIGS. 5A, 5B, 5C, 5D and 5E, shows top views of racetracks with scalloped shapes:

FIG. 5A shows a schematic description of a scalloped racetrack, in which various dimensions used throughout the figures are presented; and FIGS. 5B, 5C, 5D and 5E show scanning electron micrographs of examples of scalloped racetracks fabricated by electron beam lithography.

FIG. 6, which includes FIGS. 6A, 6B and 6C, shows micromagnetic simulations of the DW energy profile as a function of position for various scalloped racetracks, in which:

FIGS. 6A and 6B are top views of the scalloped racetracks, in which the magnetization configuration corresponding to the domain wall energy minimum (shown by the single arrowhead) is indicated by the plurality of arrows; and FIG. 6C shows the energy profile for another scalloped racetrack, as well as three top views of that racetrack with the magnetization configurations corresponding to two adjacent energy minima (1, 3) and a local energy maximum (2).

FIG. 8, which includes

DETAILED DESCRIPTION OF THE INVENTION

Figures 2A, 2B, 2C:
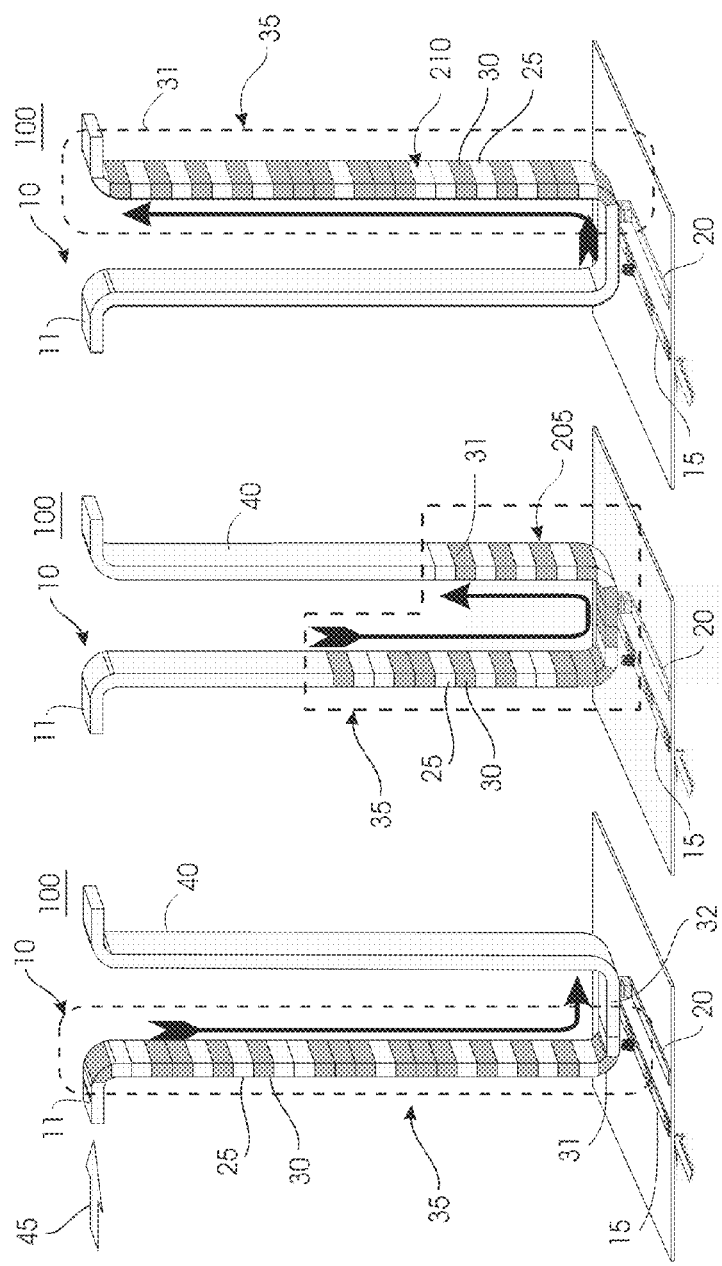
FIGS. 2A, 2B, and 2C, represents a schematic diagram illustrating a method of operation of the magnetic shift register of FIG. 1.
Figure 3A:
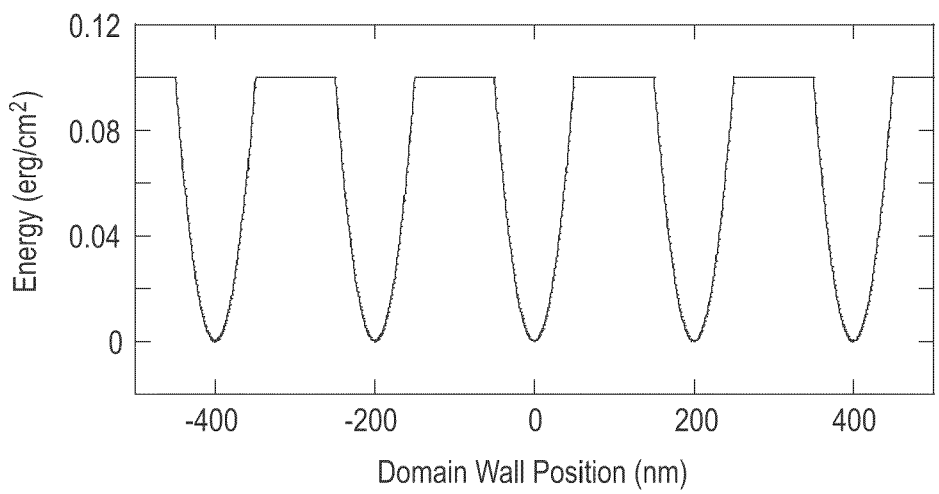
FIGS. 3A, 3B, and 3C, shows the energy of a domain wall as a function of its position along different racetracks (which themselves are not shown in this figure)

The energy landscape of a domain wall (DW) propagating along a prior art racetrack is shown in FIG. 3A. A succession of local minima of the DW's energy corresponds to sites where the track has been engineered to result in pinning of the DW when at rest. In the prior art, these pinning sites are separated by regions of the racetrack in which the energy of the DW is constant, i.e., the racetrack includes segments of constant size and of uniform material composition and hence a given domain wall has constant energy throughout these segments (see FIG. 3A). There may be extrinsic defects in these segments such as edge and surface roughness which may add small random fluctuations to the energy profile. For operation of prior art racetrack devices, these fluctuations are sufficiently small that they do not pin the DWs between the engineered DW pinning sites.

Short current pulses are used to drive each DW from one current pinning site to the next adjacent site in one direction or other along the racetrack, depending on the direction of the current (or rather the electrons) flowing through the racetrack. However, this arrangement has certain drawbacks arising from the physics of domain walls and pinning sites. First, consider that the characteristics of a given pinning site depend on the DW's structure, whether, for example, it is a vortex (V) or transverse (T) wall, and whether it is right- or left-handed (its chirality). This leads to a wide variety of behaviors when different metastable DW structures are stabilized at a given pinning site. In other words, the energy profile shown in FIG. 3A depends on details of the DW's structure. Second, even when the DW's structure remains the same during its propagation through the racetrack, there may be more than one stable position of the DW at a given pinning site. For example, when the pinning site formed by a notch in the racetrack (e.g., by reducing its width locally), the DW may prefer to sit not symmetrically at the center of the notch but rather to one or other side of the notch. Thus, the DW's position may not be well defined, so that a current pulse of a given length intended to drive a DW to the next pinning center might instead result in the DW becoming stuck between adjacent pinning centers.

Figure 3B:
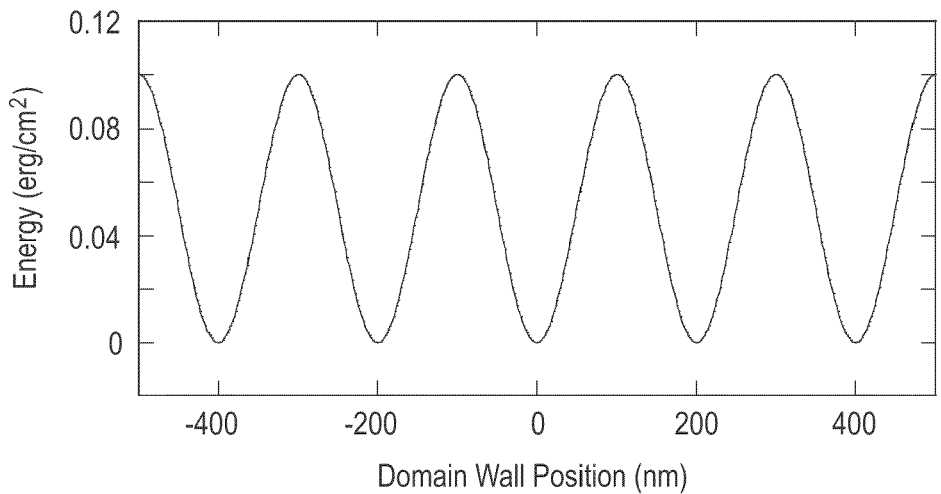

The embodiments disclosed herein, however, are designed to include undulating or modulated DW energy profiles along the racetrack (e.g., periodically undulating profiles), in which the energy varies substantially continuously (see FIG. 3B). Thus, stable DW positions (i.e., pinning sites with energy minima) are separated by energy maxima (i.e., energy barriers). DWs positioned at an unstable position at the end of a current pulse move towards a stable position once the current is turned off, so as to minimize their energy. Therefore, DWs always come to rest at one of the stable positions, and do not get "stuck" between pinning sites. In exemplary embodiments, the racetrack device may include, for example, 10, 20, 50 or more pinning sites separated by segments having a modulated or undulatory DW energy profile. Additionally, the length of the current pulse may be chosen so that the DW is always driven a distance that is at least as great as the distance to the energy maximum between the pinning sites. In this way, the DW will always be moved to the next pinning site provided that the pulse length is sufficiently long.

Accordingly, for the embodiments disclosed herein, the motion of the DWs is generally less sensitive to the length of the applied current pulses. Indeed, in prior art racetracks with localized pinning sites, the energy landscape of the DWs between the pinning site is flat, so that the DWs have to be driven from one pinning site to the next one (e.g., by current). This means, for example, that if there is some variation in the velocity of multiple DWs within a racetrack, then a faster DW may reach its pinning site before a slower DW does, so that either the fast DW will overshoot its nominal pinning site or the slower DW will not reach its targeted position for a fixed current pulse length. On the other hand, for a racetrack having segments of undulating DW energy (e.g., a scalloped racetrack), the energy landscape will urge the DWs to their corresponding pinning sites once they have traveled beyond the energy maximum that separates neighboring energy minima (e.g., the "halfway" point for a racetrack that enjoys perfect symmetry). Moreover, the pulse length needed to move DWs between neighboring pinning sites can be reduced, by taking advantage of the DW motion driven by energy relaxation at the end of the current pulse.

Figure 3C:
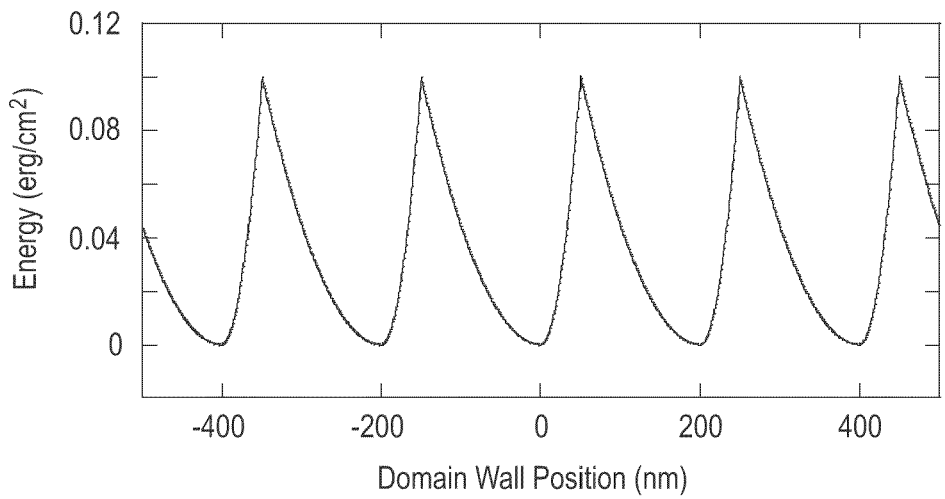

An asymmetric undulating DW energy landscape may also be used in the case of unidirectional DW motion. An example of the corresponding DW energy profile is shown in FIG. 3C. In this example, the potential wells are broad on one side and steep on the other side. Thus, when DWs are moving from left to right, they only need to be driven a short distance before they reach the next potential well.

Domain walls are boundaries between distinct magnetic regions within the racetrack. Typically, these regions are chosen to be magnetized in substantially opposite directions but this is not necessary. The angle between the magnetic moment directions in neighboring regions may be designed to be much smaller, for example, 145 degrees, 90 degrees, or 45 degrees or even smaller. The smallest angle may be determined by the signal magnitude needed to reliably detect the domain wall or may be determined by the smallest domain wall energy minimum needed to reliably pin the domain wall. A particular advantage of a reduced angle between magnetic regions is that a smaller current can be used to move the domain wall, thereby reducing the energy consumption of the racetrack memory. Another advantage is that the energy of the domain wall is reduced, thereby reducing the pinning energy and making the domain wall less sensitive to defects in the racetrack.

Figure 4A:
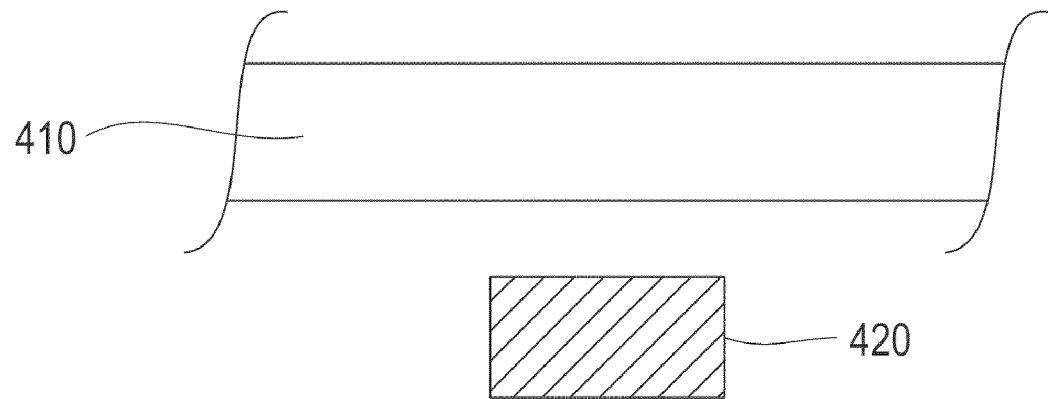
FIGS. 4A and 4B, show how permanent magnetic material and antiferromagnetic material, respectively, can be used to create pinning sites in a racetrack (shown in cross section).
Figure 4B:
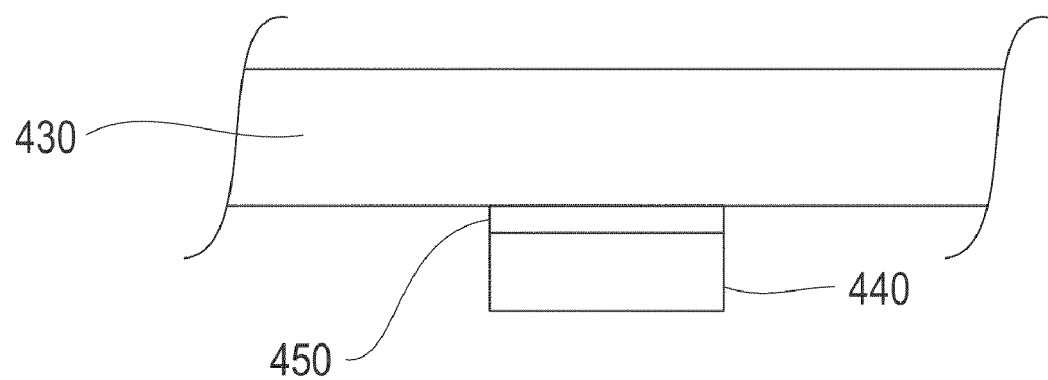

A domain wall can be pinned at a given site by various means, for example, by applying localized magnetic fields (using potential lines or by using localized magnetic structures), as shown in FIG. 4A, in which a racetrack 410 (through which DWs pass) is in proximity with a permanent magnet 420. A series of such magnets 420 can be placed along the racetrack 410, or alternatively, current may be passed through a wire (not shown) placed nearby or around the racetrack. Alternatively, the material properties of the racetrack itself may be modified as a result of ion irradiation or local interlayer coupling (e.g., through the use of ferromagnetic, ferrimagnetic or anti-ferromagnetic material or some combination of these materials in the form of a magnetic heterostructure that is external to the racetrack). An example of the latter is shown in FIG. 4B, in which a racetrack 430 is in proximity with anti-ferromagnetic material 440 separated from the racetrack 430 by a layer 440 of Pt. Also, pinning sites in a racetrack may be formed by engineering the shape of the racetrack, e.g., the pinning strength can be adjusted by varying the depth and width of a notch formed in the racetrack. This is the approach taken in most of the embodiments herein.

Engineered Undulating DW Energy Profiles

Undulating DW energy profiles can be engineered by modulating the width or the thickness of the racetrack, i.e., "scalloping" the racetrack, as shown in FIG. 5, or by modulating magnetic parameters of the magnetic material used in the racetrack (e.g., its magnetization, anisotropy, exchange stiffness, crystallographic structure, and/or material composition).

Figure 5A:
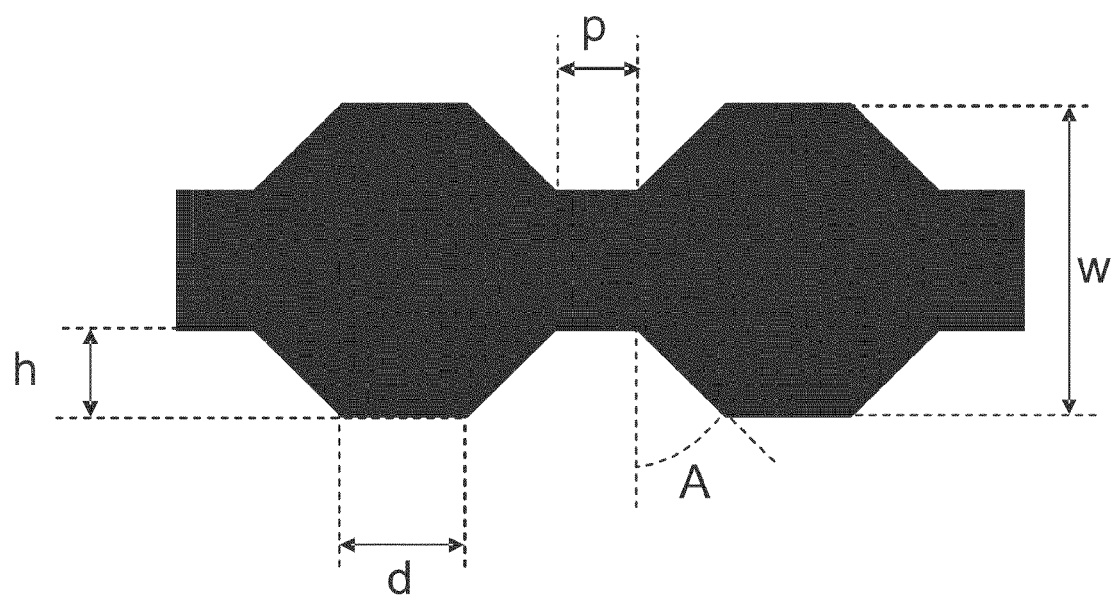

Scalloped racetracks can be readily fabricated by standard lithography techniques, including for example, electron beam lithography (as in the examples of FIGS. 5B, C, D and E) and deep UV lithography. FIG. 5A shows a schematic representation of the devices shown in FIGS. 5B, C, D and E. In these devices the racetrack width varies from a maximum value of w to a minimum value of (w−2h). The extent along the racetrack of the segments of the racetrack of width w and of width (w−2h) is given by the parameters d and p, respectively. Between the regions of width w and width (w−2h) the boundary of the racetrack makes an angle A from a line orthogonal to the length of the racetrack. Note that A is a dependent variable which is defined by the quantities, w, (w−2h), d and p. For a scalloped racetrack, a difference between the maximum and minimum widths of the racetrack (e.g., w versus (w−2h)) of at least 2% can be sufficient to form pinning sites separated by undulating DW energy profiles; in other embodiments this difference may be at least 5, 10, or even 30%.

The examples in FIGS. 5B, C, D and E each have nominal values of w=400 nm and h=150 nm, but d and p are varied between nominal values of 0 and 150 nm in the four examples shown. Similarly, A=45 degrees in two of the examples and 60 degrees in the other two examples. The figures show scanning electron micrographs of the top surfaces of the fabricated racetracks: the measured value of w is indicated in each of the figures. The measured value of w lies between 395 and 405 nm and is in good agreement with the design value of 400 nm.

Note that the energy landscape of the domain wall may have a complicated dependence on the geometrical shape of the racetrack and does not necessarily follow that of the geometry of the racetrack, as shown below.

Figure 6A:
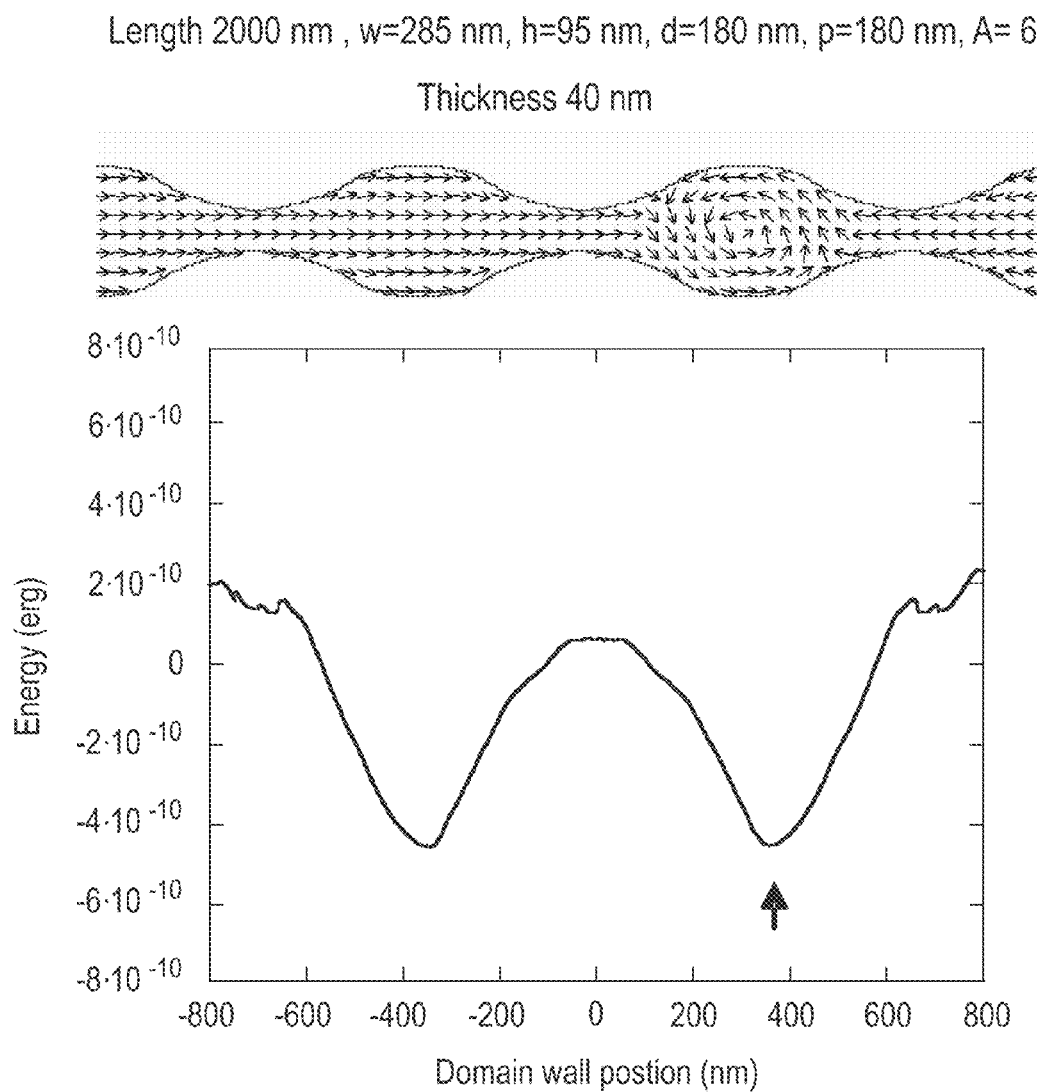
Figure 6B:
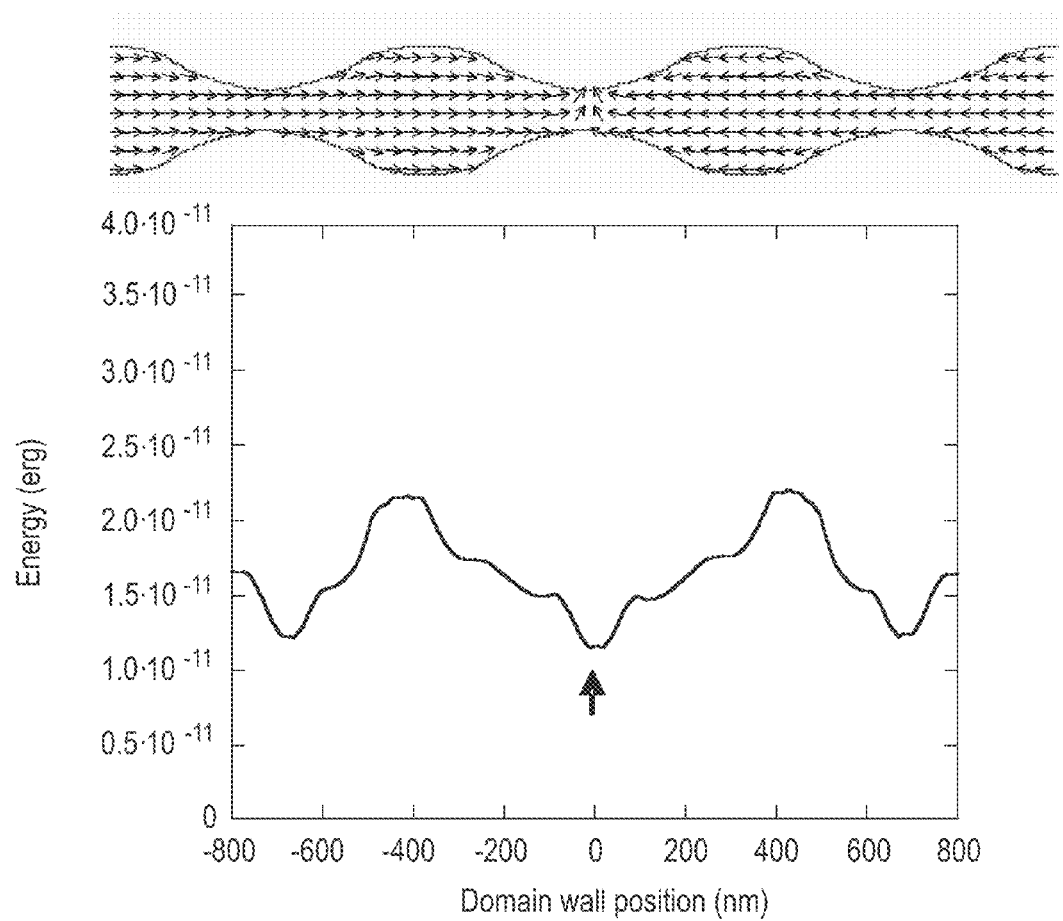

In the following, examples of engineered undulating DW energy profiles for two different types of racetracks are described. First, consider the case of head-to-head domain walls in a track made of a soft magnetic alloy (e.g., formed from a binary Ni—Fe or a ternary NiCoFe alloy or a quaternary alloy of, for example, NiCoFeMo). Since the DW energy is a complex function of the racetrack shape and size, micromagnetic simulations are employed to demonstrate operability. Examples of DW energy profiles for domain walls are shown in FIGS. 6A and 6B for two scalloped racetracks with respective thicknesses (corresponding to distance into the page) of 40 and 5 nm, respectively. Each of FIGS. 6A, 6B, and 6C, corresponds to a micromagnetic simulation of $Ni_{81}Fe_{19}$ (permalloy) racetracks where magnetic material was chosen to have these properties: magnetization Ms=800 emu/cm$^3$, exchange stiffness A=1 μerg/cm, and crystalline anisotropy K=1000 erg/cm$^3$.

Figure 6C:
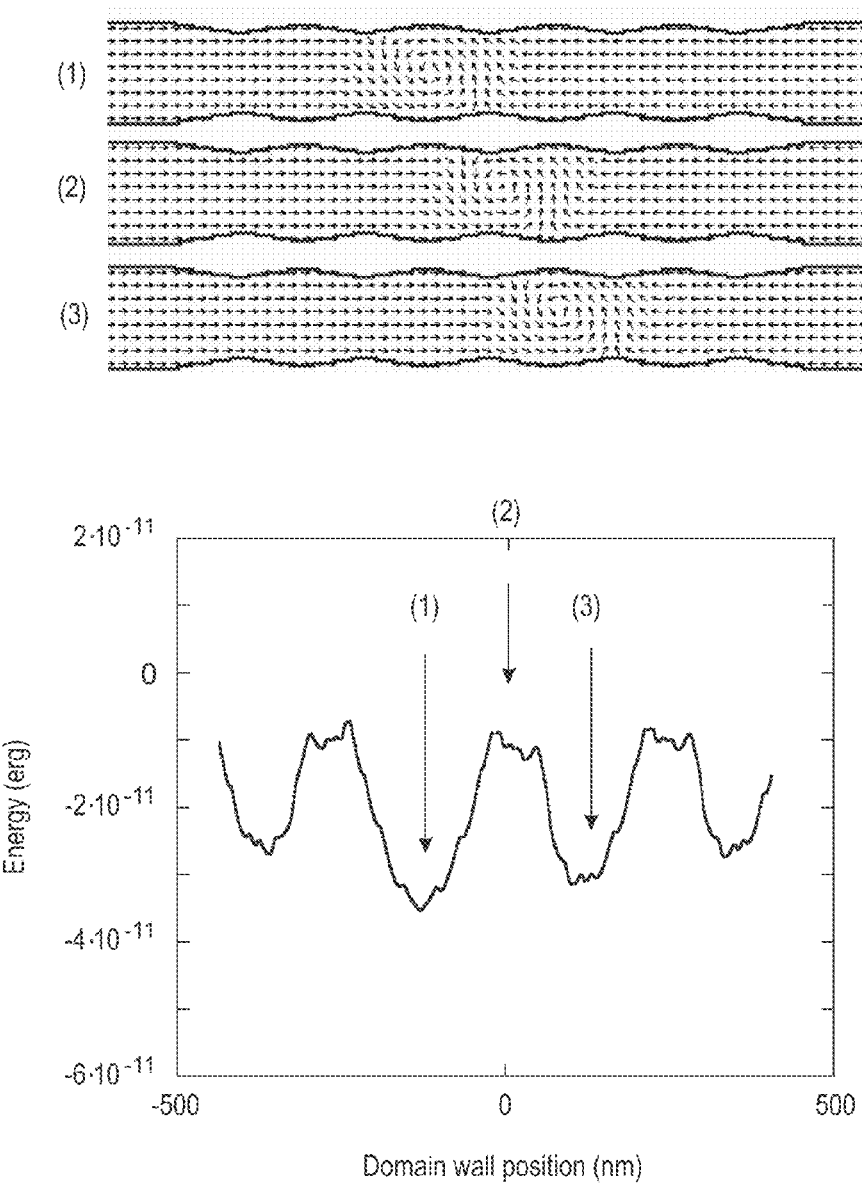

In each of FIGS. 6A, 6B, and 6C a map of the magnetization distribution is shown. The arrows shown in the figures represent the direction of the local magnetization. In the simulations only the direction but not the magnitude of the magnetization is allowed to vary. In the first case (FIG. 6A), the domain wall has a vortex structure, and the energy minima are located where the track is widest. Note that there is a single domain wall in the racetrack, and the energy of this domain wall is calculated as the domain wall is shifted along the racetrack. The narrow regions of the track correspond to energy barriers because the vortex wall energy increases due to confinement. As the DW propagates along the racetrack, it experiences the undulating energy profile shown in FIG. 6A. Note that since the simulation is carried out for a racetrack of finite length (here 2000 nm), the energy of the DW is modified when it is close to either end of the racetrack. In the second case (FIG. 6B), for a track thickness of 5 nm, domain walls have preferably transverse structures, and the energy minima are located at the narrow regions of the track. The DW energy also exhibits an undulating dependence on the DW position. Note there are small local minima between the lowest and the highest energy points, but these local minima are designed to be too small to result in pinning of the DW.

FIG. 6C shows an example of a racetrack with a thickness of 20 nm and with very shallow scallops. At the top of the figure are calculated magnetization distributions in the racetrack when a vortex domain wall is moved from a wider region to a narrower region to a wider region along the racetrack. The first and third magnetic configurations labeled (1) and (3) correspond to energy minima and the second (labeled (2)) to an energy maximum.

Note that again in this example the energy is minimized when the vortex domain wall sits in the wider part of the racetrack. Note that it is also possible to consider the situation where the structure of the domain wall is caused to be transformed during the motion of the domain wall. Thus, if the DW structure can be transformed each time the DW is shifted (e.g., under a current pulse of suitable shape or length or a combination of shape and pulse) then the storage density of the racetrack can be doubled, since the vortex DW will sit at the wider part of the racetrack to minimize its energy but the transverse domain wall will sit at the narrower part of the racetrack to minimize its energy. Indeed the very motion of the DW from a wider to a narrower part of the racetrack may engender a change in the structure of the DW in order to minimize its energy. This doubling effect may also be achieved using a racetrack device having regions of alternating magnetic properties, so that a vortex (transverse) domain wall is transformed to a transverse (vortex) domain wall when moving to an adjacent region.

The less that the domain wall energy undulates as a function of the DW position, the more important is the influence of thermal fluctuations and the role of defects. Undulations in DW energy are effective only if they are significantly larger than random energy fluctuations, for example, those arising from thermal fluctuations or those due to small perturbations in the smoothness of the surfaces or edges of the racetrack.

In a second example, consider the case of racetracks made from magnetic material with perpendicular magnetic anisotropy. In this case the domain walls have a structure referred to as a Bloch domain wall in which the magnetization rotates within the plane of the domain wall from a direction perpendicular to the racetrack to the opposite direction perpendicular to the racetrack. In this case, the domain wall energy per unit area is determined by the intrinsic magnetic properties of the racetrack material itself, and is largely independent of the racetrack size and shape. In a first approximation, in which it is assumed that the plane of the DW is always perpendicular to the direction of the racetrack, i.e., without any curvature or bends, the total DW energy is directly proportional to the track width w and thickness t:

$$E=\sigma tw$$

where $\sigma=4(AK)^{1/2}$ is the DW energy per unit area, A is the exchange stiffness, and K is the perpendicular anisotropy energy per unit volume.

Figure 7:
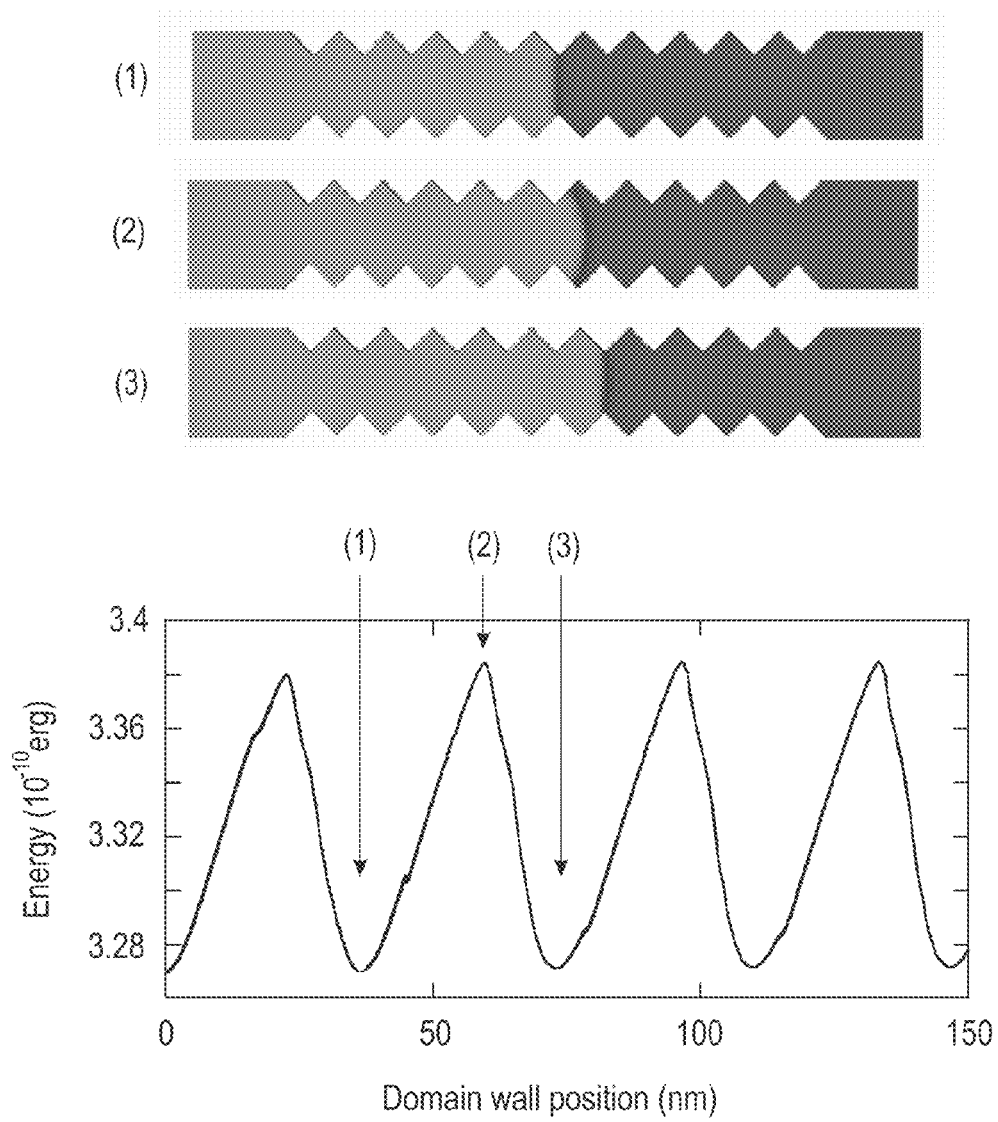
FIG. 7 shows micromagnetic simulations of the DW energy profile for a "sawtooth" racetrack with perpendicular magnetic anisotropy (PMA). The magnetization in the magnetic domains points either out of the plane of the figure (on the left-hand side of the racetrack) or in the plane of the figure (on the left-hand side of the racetrack). Three examples of the magnetic domain structure are shown (top views), corresponding to adjacent stable states (energy minima, states 1 and 3) separated by an unstable state (energy maximum, state 2).

This expression shows that the energy landscape can by modulated by modulating the width (or the thickness) of the track, assuming no change in the basic DW structure. However, the DW structure is likely to be deformed to a greater or lesser degree or may even undergo a transformation to a different structure as the DW moves through portions of the racetrack with different dimensions. By controlling the dimensions of the track and the extent to which these are modulated, the extent of any DW deformation and the possibility of any DW transformation can be controlled. Micromagnetic simulations are very useful in determining the profile and structure of the DW and any deformation or change to this structure, depending on the racetrack dimensions and perturbations to these dimensions, as the DW is shifted back and forth along the racetrack. An example is shown in FIG. 7 for a "sawtooth" racetrack. The maximum width and thickness (into the page) of the racetrack are 86 nm and 5 nm, respectively. Typical magnetic parameters for Co/Pt multilayers with large perpendicular magnetic anisotropy are used in the simulations (Ms=500 emu/cm$^3$, A=1 μerg/cm, perpendicular anisotropy $K_P$=5.0 10$^6$ erg/cm$^3$). FIG. 7 shows the DW energy profile calculated when the DW is swept along the racetrack, along with examples of the magnetic domain structure in two consecutive stable states (energy minima, (1) and (3)) separated by an unstable state (energy maximum, (2)).

Analytical Modeling

The particular advantages of undulating DW energy profiles for domain wall motion driven by current pulses can be understood within the framework of the well-known one-dimensional model of domain wall dynamics. The model includes both adiabatic and non-adiabatic spin transfer torques from spin polarized current. Additional details regarding the model and its different parameters can be found in Luc Thomas, Masamitsu Hayashi, Xin Jiang, Charles Rettner and Stuart Parkin, *Oscillatory dependence of current-driven magnetic domain wall motion on current pulse length*, Nature 443, 197 (2006) and Luc Thomas, M. Hayashi, X. Jiang, R. Moriya, C. Rettner and S. S. P. Parkin, *Resonant amplification of magnetic domain wall motion by a train of current pulses*, Science 315, 1553 (2007).

Two types of pinning potentials are considered, as illustrated in FIGS. 3A and 3B which shows the DW energy density versus the position of the DW along the racetrack. In the first case, potential wells have a parabolic shape of width $q_0$ and are separated by a distance $q_P$. The energy between the wells is flat. In the second case, the pinning potential profile is a sine-wave with period $q_S$. The depth of the pinning potential wells is the same for both profiles.

The potential profiles in these two cases are written as follows:

Parabolic wells: $E=V_P(q-xq_P)^2/q_0$ (for $|q-xq_P|<q_0$); $E=V_P q_0$ elsewhere, where x is a signed integer and q is the position of the center of the domain wall.

Undulating potential: $E=V_S q_S/2 \cos(2\pi q/q_S)$

The parameters of the model are as follows:

$V_P=2\times10^4 \text{erg/cm}^3$, $q_0=50\text{nm}$ and $q_P=200\text{nm}$ $V_S=5\times10^3 \text{erg/cm}^3$, $q_S=200\text{nm}$, for the parabolic (P) and sine wave (S) shaped potential wells, respectively.

In the one-dimensional model, domain walls are described by their dynamical domain wall width $\Delta$ and the anisotropy field $H_k$. Two sets of parameters are chosen to describe (i) vortex head-to-head domain walls in racetracks made of soft magnetic material and (ii) Bloch walls in racetracks with perpendicular magnetic anisotropy. Note that these parameters depend on the detailed properties of the racetrack and can vary significantly. The values used below are chosen to illustrate the domain wall dynamics in these two classes of magnetic materials.

Head-to-head vortex wall: $\Delta=20$ nm, $H_k=2000$ Oe

Bloch wall: $\Delta=10$ nm, $H_k=400$ Oe

Other important parameters for the domain wall dynamics are the Gilbert damping $\alpha$ (which quantifies the DW's energy loss to the racetrack's crystalline structure) and the dimensionless parameter $\beta$, which quantifies the non-adiabatic spin torque. Here we choose $\beta=\alpha$. Note that the current density is expressed in terms of the rate of spin angular momentum transfer u (in m/s), which is proportional to the current density J and the spin polarization P. For P=0.5, u=1 m/s corresponds to a current density J~$2.8\times10^6$ A/cm$^2$.

Figure 8A:
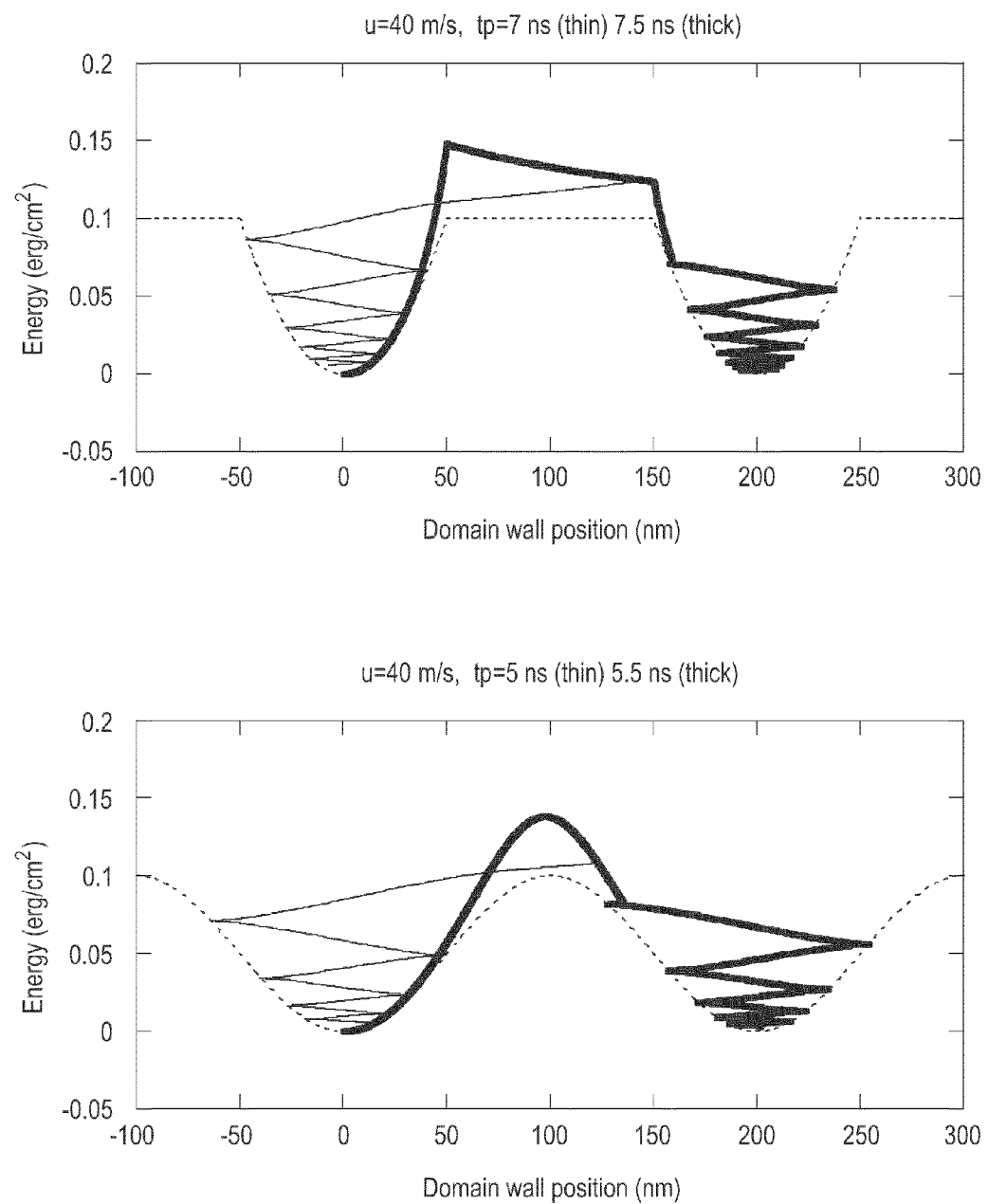
FIGS. 8A, 8B, and 8C, show analytical calculations of the DW energy in response to a current pulse; the model parameters are shown in the figure and discussed in the text. The dashed lines correspond to the energy of a stationary DW, i.e., the DW's potential energy, whereas the solid lines correspond to the total energy of the moving DW.

Results of the model are shown in FIG. 8, which depicts the domain wall energy during its motion for the two sets of parameters just described, but with different Gilbert damping parameters: (A) Bloch wall; $\alpha=0.01$, (B) head-to-head vortex DW; $\alpha=0.01$, and, (C) head-to-head vortex; $\alpha=0.05$. The upper panels in each of FIGS. 8A, B and C correspond to the case of parabolic potential wells separated by flat regions, whereas the lower panels in each figure correspond to the case of a sinusoidal undulating potential. The amplitude of the current pulse is chosen such that the DW moves from one potential well to the next for both the parabolic and undulating potential profiles. The quasi-static (or stationary) DW energy profiles are shown by dotted lines. Thick solid lines show the DW energy as a function of the DW position for pulse lengths slightly longer than the minimum pulse length needed for DW motion from the left-hand well to the right-hand well. Thin solid lines show the DW energy for pulse lengths slightly shorter than this minimum length. At time zero, the domain wall is at rest in the potential well located at q=0. When the current pulse is turned on, the DW can exit the potential well and propagate along the track if the current density exceeds a threshold value. However, the DW can only reach the next potential well if the pulse length is long enough.

After the end of the current pulse, the DW relaxes toward its local energy minimum. Its trajectory depends on the current density and the magnitude of the Gilbert damping $\alpha$. For large values of $\alpha$ (e.g., $\alpha=0.05$), the DW follows a low energy trajectory very close to the pinning potential. In this case, there is little momentum-driven relaxation at the end of the pulse, and the propagation of the DW after the pulse is driven by the local energy landscape. On the other hand, for small damping (typically $\alpha=0.01$) the DW acquires significant momentum during the current pulse, so that momentum driven motion after the current is turned off drives the domain wall in the direction opposite to its motion under current.

For a given DW to reach its target potential well (corresponding to a desired pinning site), two conditions are required: firstly, any energy barriers must prevent backward motion, and secondly, the local potential must provide a driving force that urges the DW towards the desired pinning site.

In the case of parabolic potential wells separated by segments having a flat energy landscape, backward motion of the DW is blocked only if the domain wall reaches the target potential well during the pulse. In the case of large damping, even though the backward motion is almost negligible, the DW will remain between potential wells if the current pulse is too short. On the other hand, for undulating potentials (such as those found with the scalloped racetracks of FIG. 6), the DW needs to travel a shorter distance to reach the target potential well. For large damping, the minimum distance the DW has to travel during the current pulse is the point at which its energy is a maximum. For smaller damping, because of momentum-driven motion, this minimum travel distance is significantly increased.

The minimum pulse length needed for well-to-well current driven DW motion is reduced in the case of undulating DW energy profiles. The maximum reduction is achieved for large damping. In this case, the reduction of the pulse length is calculated from the energy landscape described above:

$t_S/t_P=q_S/2/(q_P-q_0)$ where $t_S$ and $t_P$ are the pulse lengths for undulating and parabolic wells, respectively. For the values used in this example, the pulse length is reduced by a factor 1.5 when undulating DW energy profiles are used.

Figure 8B:
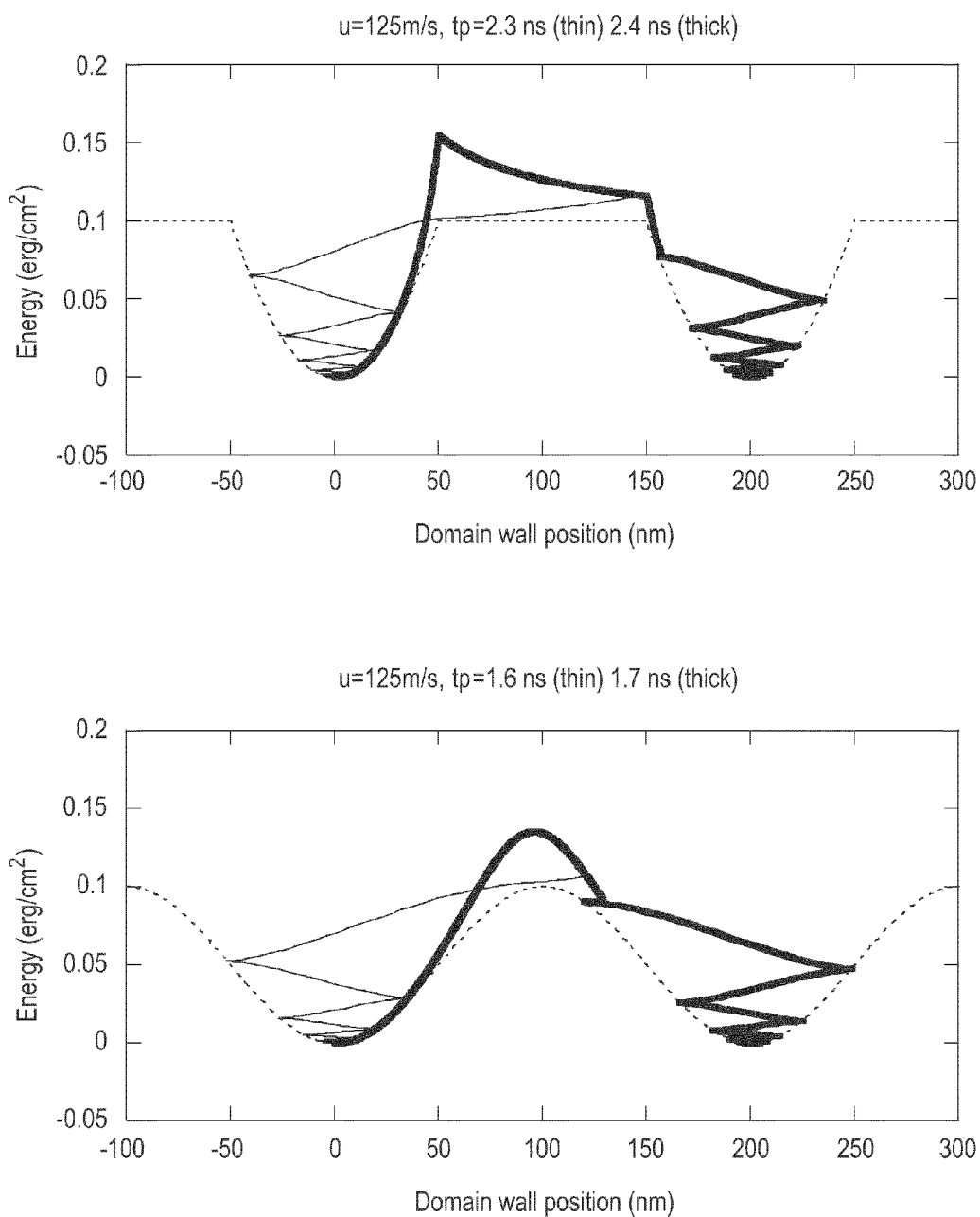
Figure 8C:
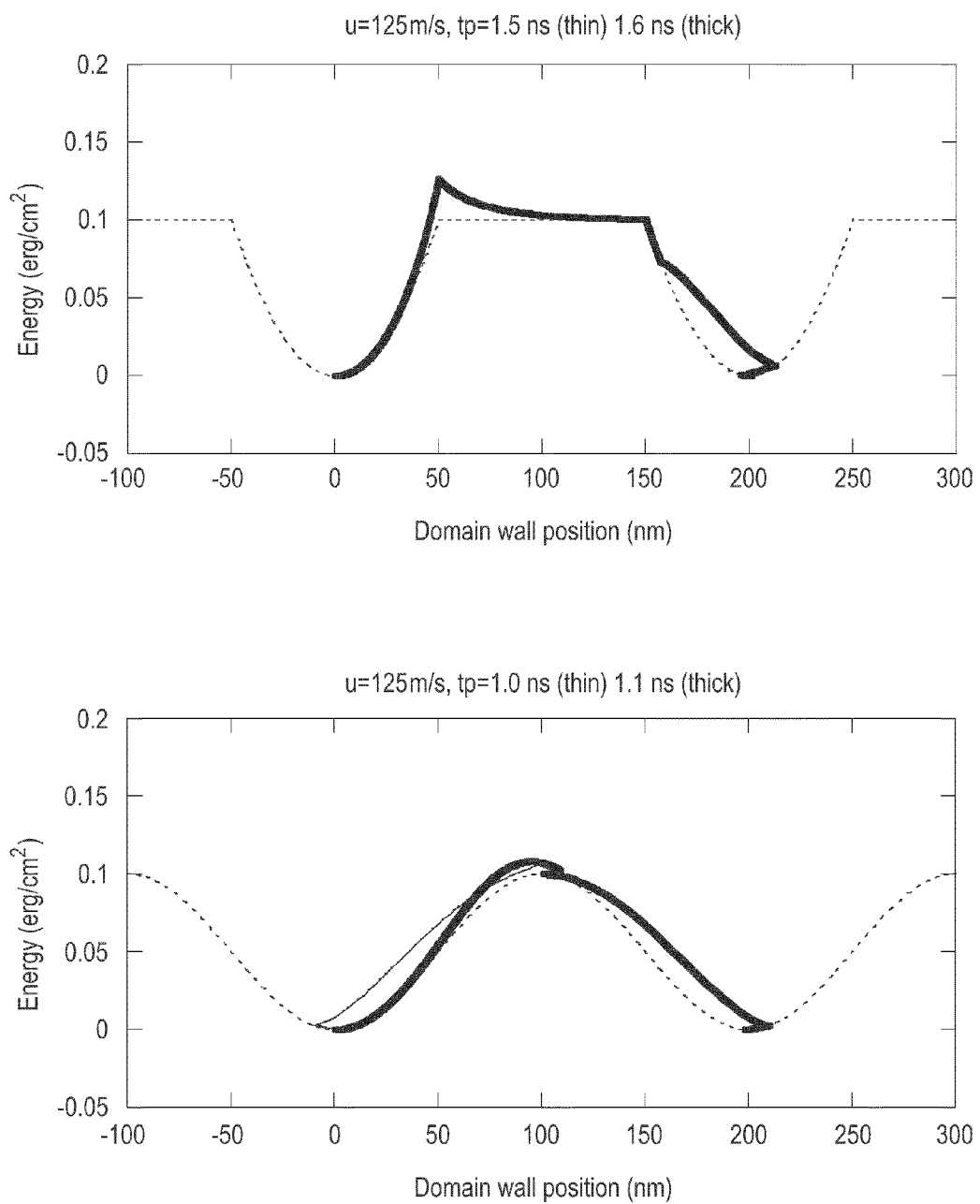
Figure 9:
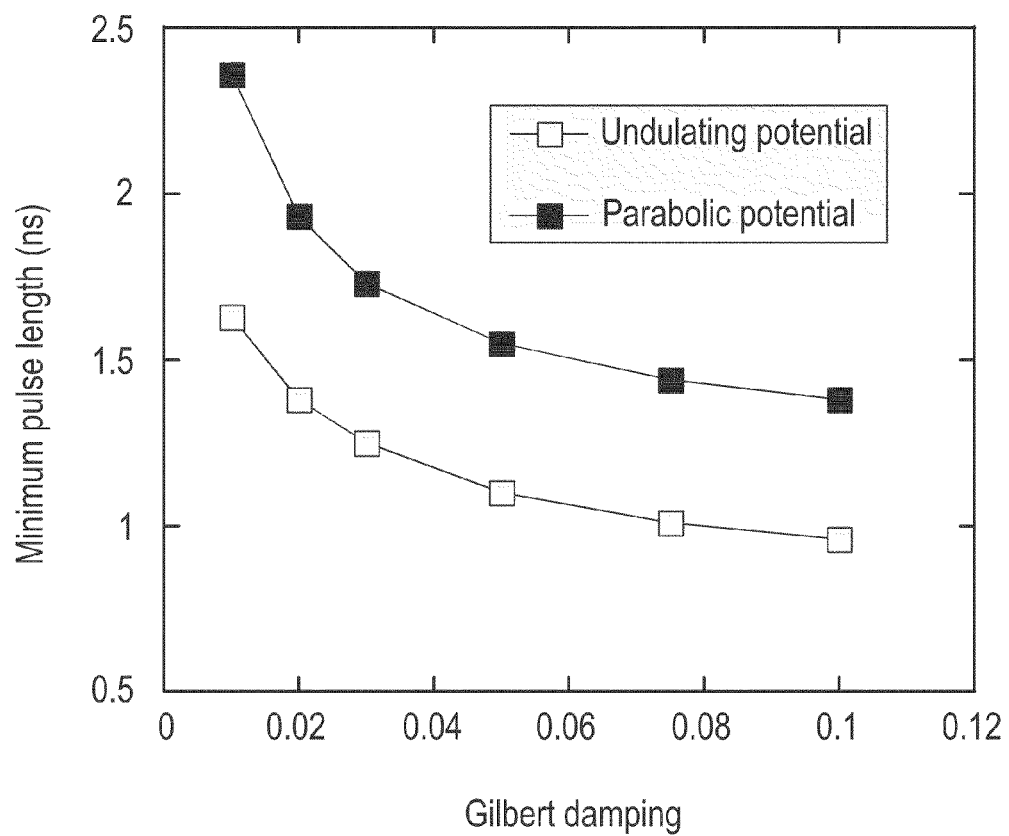
FIG. 9 shows analytical calculations of the minimum pulse length required to move a DW from one energy minimum to the next, calculated as a function of the Gilbert damping parameter α for parabolic (darkened symbols) and undulating (open symbols) DW energy profiles. Both the DW energy profiles and model parameters are the same as those used in FIGS. 8B and 8C.

FIG. 9 shows the minimum pulse length needed for reliable DW motion from one well to the next one versus the magnitude of the Gilbert damping parameter, calculated for both parabolic and undulating DW energy profiles using the same set of parameters as in FIGS. 8B and 8C. The minimum pulse length is reduced significantly for undulating DW energy profiles irrespective of the Gilbert damping. In both cases, longer pulses are needed for small damping because the momentum-driven motion at the end of the pulse is more important. If bi-directional DW motion is required, the reduction of the pulse length for undulating DW energy profiles is limited to at most a factor of 2. However, if the DW motion can be unidirectional, the improvement can be even more significant.

Figure 10:
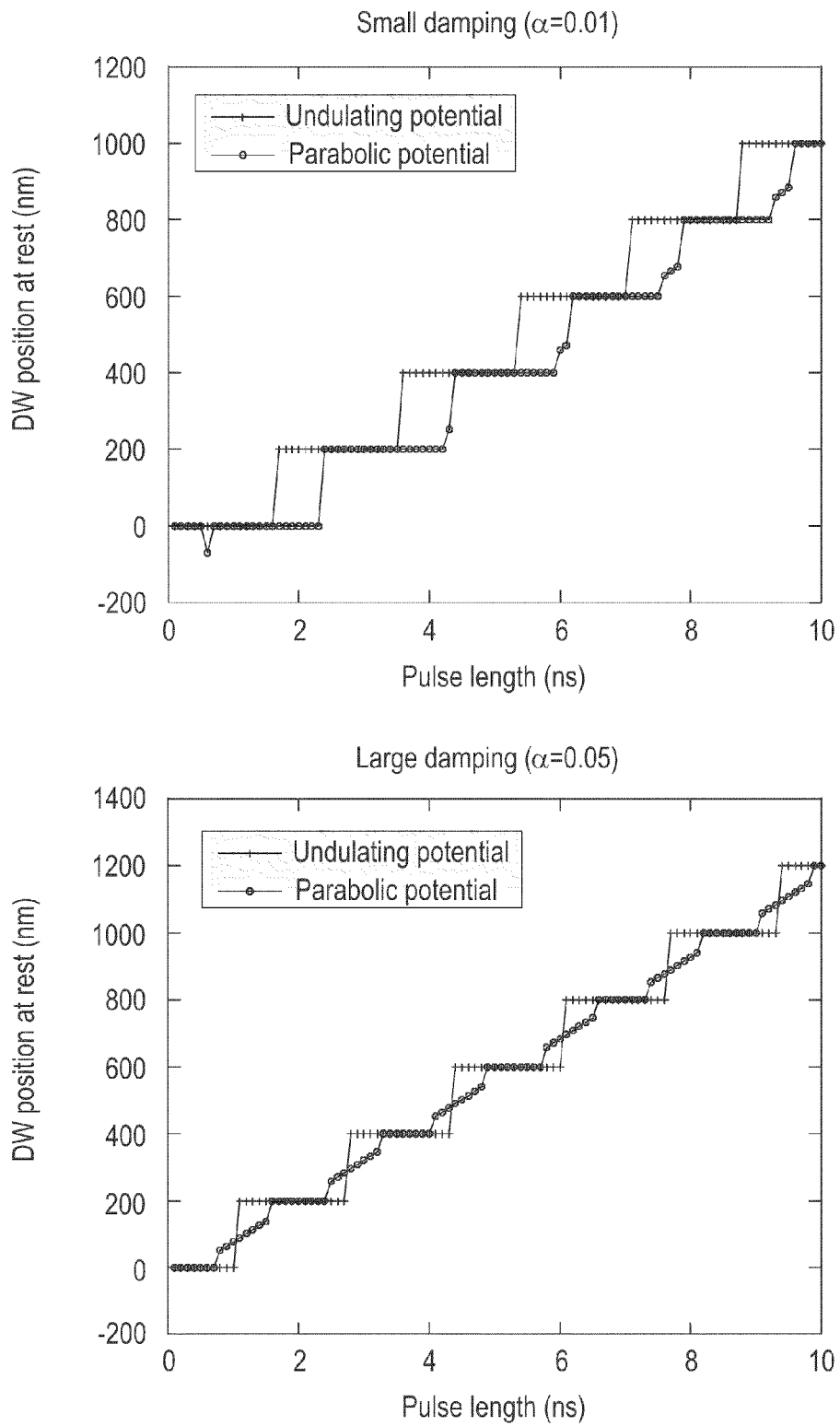
FIG. 10 shows the DW position at rest (200 ns after the end of the current pulse) calculated as a function of the current pulse length, for α=0.01 (left) and α=0.05 (right) in the case of parabolic and undulating DW energy profiles. The model parameters used are the same as those used in FIGS. 8B and 8C.

Undulating DW energy profiles also allow for better control of the DW final position after application of the current pulses. Because the DW always relaxes toward a local energy minimum after the current pulse, slight fluctuations in the pulse length do not affect the DW's eventual position. This is illustrated in FIG. 10 for the two DW energy landscapes described above in connection with FIGS. 8-9. The DW position at rest is calculated as a function of the length of the current pulse. In the case of a parabolic energy profile, the DW can remain between two neighboring wells, whereas for the undulating energy profile the final position is always within a potential well. Note that for small damping, the DW is more likely to relax towards a potential well after the pulse, even in the case of a parabolic DW energy profile. This is because its momentum can drive it over significant distances. However, for large damping, the momentum driven relaxation is less important and the probability for the DW to rest between two wells is increased.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

What is claimed is:

1. A method for use with a magnetic racetrack device having given regions, the method comprising:
   placing domain walls having a first structure and domain walls having a second, different structure along the racetrack at stable positions corresponding to the given regions, the domain walls having the first structure and the domain walls having the second structure occupying alternating positions along the racetrack; and
   applying a current pulse to the racetrack, so that each of the domain walls moves to an adjacent one of the given regions, wherein:
   (i) the domain walls having the first structure move from regions where they have a local minimum energy to adjacent regions where the energy of domain walls having the first structure is a local maximum, with a concomitant transformation of the domain walls having the first structure into domain walls having the second structure; and
   (ii) the domain walls having the second structure move from regions where they have a local minimum energy to adjacent regions where the energy of domain walls having the second structure is a local maximum, with a concomitant transformation of the domain walls having the second structure into domain walls having the first structure.

2. The method of claim 1, wherein the first structure is a vortex structure and the second structure is a transverse structure.

3. The method of claim 1, further comprising applying a subsequent current pulse to the racetrack, so that each domain wall moves to another one of the given regions.

4. The method of claim 1, wherein the given regions correspond to alternating local minimum and maximum cross sections of the racetrack.

5. The method of claim 1, wherein the given regions correspond to alternating magnetic properties of the racetrack.

6. The method of claim 1, wherein the racetrack device is a data storage device.

7. The method of claim 1, wherein the racetrack device has a data storage density that is greater as a result of using both domain walls having the first structure and domain walls having the second structure, compared to a racetrack device having domain walls of only one structure.

\* \* \* \* \*